United States Patent
Tsai et al.

(10) Patent No.: US 11,862,751 B2
(45) Date of Patent: Jan. 2, 2024

(54) LIGHT-EMITTING DIODE TESTING CIRCUIT, LIGHT-EMITTING DIODE TESTING METHOD AND MANUFACTURING METHOD

(71) Applicant: EPISTAR CORPORATION, Hsinchu (TW)

(72) Inventors: Chia-Chen Tsai, Hsinchu (TW); Jia-Liang Tu, Hsinchu (TW); Chi-Ling Lee, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 338 days.

(21) Appl. No.: 17/169,057

(22) Filed: Feb. 5, 2021

(65) Prior Publication Data

US 2021/0249558 A1 Aug. 12, 2021

Related U.S. Application Data

(60) Provisional application No. 62/975,165, filed on Feb. 11, 2020.

(51) Int. Cl.
| | |
|---|---|
| *H01L 33/00* | (2010.01) |
| *H01L 21/683* | (2006.01) |
| *H01L 21/66* | (2006.01) |
| *H01L 33/62* | (2010.01) |
| *H01L 25/075* | (2006.01) |

(52) U.S. Cl.
CPC ...... *H01L 33/0095* (2013.01); *H01L 21/6835* (2013.01); *H01L 22/22* (2013.01); *H01L 25/0753* (2013.01); *H01L 33/62* (2013.01); *H01L 2221/68354* (2013.01); *H01L 2221/68368* (2013.01); *H01L 2933/0066* (2013.01)

(58) Field of Classification Search
CPC . H01L 33/0095; H01L 21/6835; H01L 22/22; H01L 25/0753; H01L 33/62; H01L 2221/68354; H01L 2221/68368; H01L 2933/0066; H01L 27/156; H01L 22/14; H01L 22/34; G01R 31/2635
See application file for complete search history.

(56) References Cited

U.S. PATENT DOCUMENTS

| | | | |
|---|---|---|---|
| 2007/0166851 A1* | 7/2007 | Tran | H01L 33/22 438/22 |
| 2014/0267683 A1* | 9/2014 | Bibl | H10K 50/00 348/87 |

* cited by examiner

*Primary Examiner* — Ratisha Mehta
(74) *Attorney, Agent, or Firm* — Patterson + Sheridan, LLP

(57) ABSTRACT

A manufacturing method for an LED includes: providing a substrate having an upper surface divided into a plurality of zones; a LED group formed on each of the zones and wherein: a plurality of the LED groups includes a first LED group; and the LEDs of the first LED group include a defective LED; forming a testing circuit on the substrate to electrically connect the LEDs; testing the first LED group by the testing circuit; recording a position of the defective LED; providing a carrier; and performing one of the following steps by the position of the defective LED: removing the defective LED from the substrate and then transferring the other LEDs in the first LED group to the carrier; transferring the other LEDs other than the defective LED in the first LED group to the carrier; or transferring the LEDs to the carrier and repairing it on the carrier.

20 Claims, 7 Drawing Sheets

LIGHT-EMITTING DIODE TESTING CIRCUIT, LIGHT-EMITTING DIODE TESTING METHOD AND MANUFACTURING METHOD

CROSS-REFERENCE TO RELATED APPLICATIONS

This application claims the benefit of U.S. provisional application No. 62/975,165 filed on Feb. 11, 2020, and the content of which is incorporated by reference in its entirety.

BACKGROUND

Technical Field

The present application relates to a light-emitting diode (LED) testing circuit, a LED testing method and a LED manufacturing method, more specifically, to a LED testing circuit, a LED testing method and a LED manufacturing method for small-sized LEDs.

Description of the Related Art

In a conventional LED testing method such as electroluminescence (EL) testing, probes are applied to the electrodes of the LED to input a testing current to obtain the photoelectric characteristics of the LED. Specifically, the tips of the two probes respectively touch the p-electrode and n-electrode of the LED. However, in a small-sized LED, the size of the electrodes and the space between the two electrodes are also small. It is difficult to testing the small-sized LEDs by using conventional probes and conventional testing methods.

SUMMARY

A manufacturing method for a LED includes: providing a substrate, including an upper surface, wherein the upper surface is divided into a plurality of zones; a LED group which includes a plurality of LEDs formed on each of the plurality of zones and wherein: a plurality of the LED groups includes a first LED group; and the plurality of LEDs of the first LED group includes one or more defective LEDs; forming a testing circuit on the substrate, electrically connecting the plurality of LEDs in the first LED group to form a parallel circuit or a series-parallel circuit; testing the first LED group by the testing circuit; recording a position of the one or more defective LEDs; providing a target carrier or a module carrier; and performing one of the following steps by the position of the one or more defective LEDs: removing the one or more defective LEDs from the substrate, and then transferring the other of the plurality of LEDs in the first LED group to the target carrier or the module carrier; not transferring the one or more defective LEDs, but transferring the other of the plurality of LEDs in the first LED group to the target carrier or the module carrier; or transferring the plurality of LEDs to the target carrier or the module carrier and repairing the one or more defective LEDs on the target carrier or the module carrier.

A manufacturing method for a LED includes: providing a substrate, including a first upper surface, wherein the first upper surface is divided into a plurality of zones; a LED group which includes a plurality of LEDs is formed on each of the plurality of zones and wherein: a plurality of the LED groups includes a first LED group; and the plurality of LEDs of the first LED group includes one or more defective LEDs; proving a temporary carrier, including a second upper surface; forming a testing circuit on the second upper surface; transferring the first LED group to the second upper surface from the substrate and electrically connecting the plurality of LEDs in the first LED group and the testing circuit to form a parallel circuit or a series-parallel circuit; testing the first LED group by the testing circuit.

DETAILED DESCRIPTION OF THE EMBODIMENTS

To better and concisely explain the disclosure, the same name or the same reference number given or appeared in different paragraphs or figures along the specification should has the same or equivalent meanings while it is once defined anywhere of the disclosure.

Figure 1:
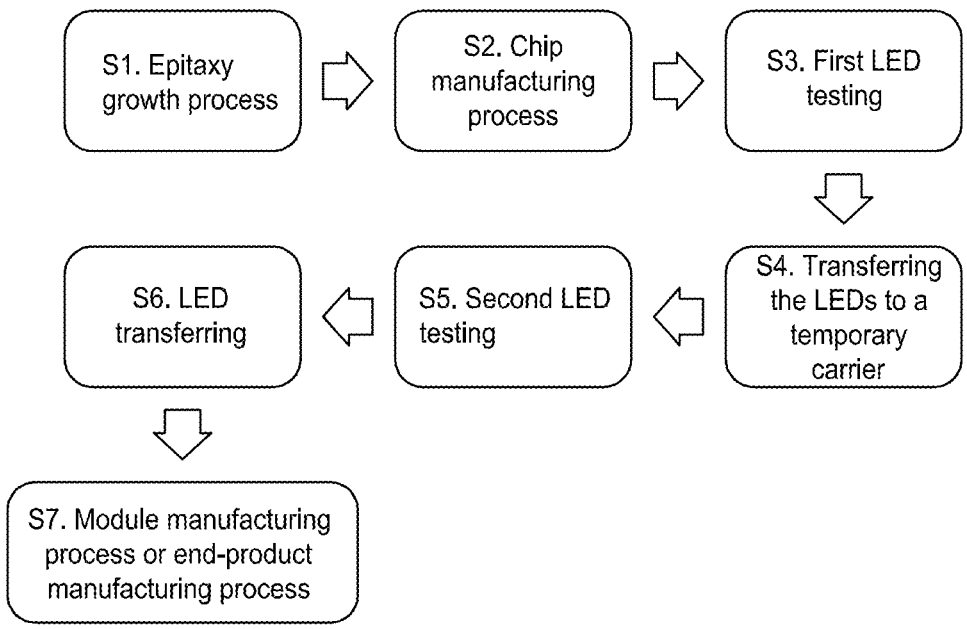
FIG. 1 shows an LED manufacturing method in accordance with an embodiment of the present application.
Figure 2:
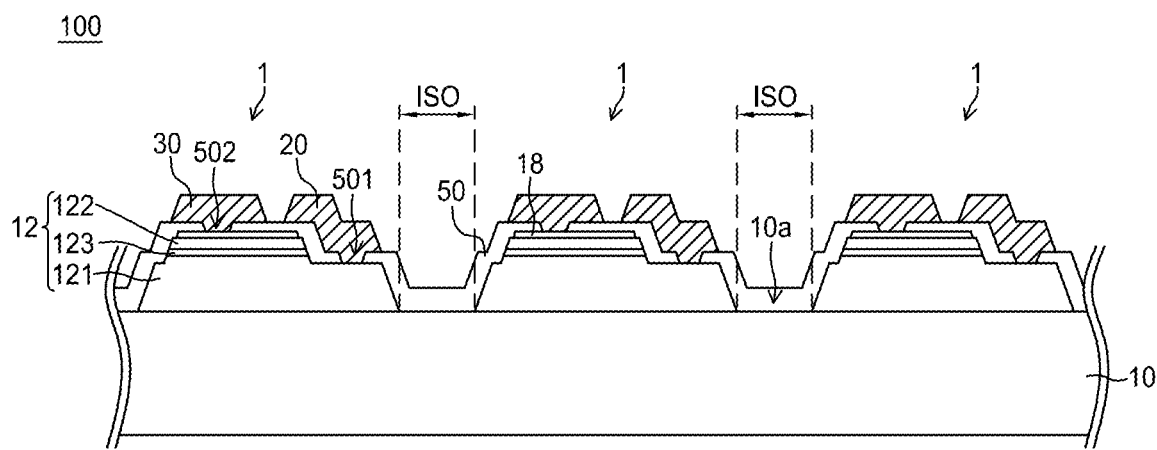
FIG. 2 shows a cross-sectional view of a step in the LED manufacturing method in accordance with an embodiment of the present application.

FIG. 1 shows an LED manufacturing method in accordance with an embodiment of the present application. FIG. 2 shows a cross-sectional view of an LED wafer 100 which is composed by a plurality of LEDs 1 formed on the substrate 10 after the step S1 and the step S2 are completed. Referring to FIG. 1 and FIG. 2, first, an epitaxy growth is performed in the step S1 to form a semiconductor stack 12 on an upper surface 10a of a substrate 10. The semiconductor stack 12 includes a first semiconductor layer 121, an active region 123 and a second semiconductor layer 122. Next, a chip manufacturing process is performed in the step S2. A transparent conductive layer 18 is formed on the semiconductor stack 12. The semiconductor stack 12 is then separated into a plurality of LEDs 1 on the substrate 10 by an isolation region ISO. An insulating layer 50, a first electrode 20 and a second electrode 30 are sequentially formed on the semiconductor stack 12. In one embodiment, the plurality of LEDs 1 is arranged on the substrate 10 in an array.

The plurality of LEDs 1 is isolated from each other by the isolation region ISO. The insulating layer 50 covers the isolation regions ISO, the semiconductor stacks 12 and the transparent conductive layers 18. The insulating layer 50 comprises an opening 501 exposing the first semiconductor layer 121 and another opening 502 exposing the transparent conductive layer 18. The first electrode 20 is formed on the insulating layer 50 and electrically connected to the first semiconductor layer 121 through the opening 501. The second electrode 30 is formed on the insulating layer 50 and electrically connected to the second semiconductor layer 122 through the opening 502.

Substrate

The substrate 10 can be a growth substrate, including a GaP substrate or a GaAs substrate for growing AlGaInP thereon, or a sapphire substrate, a GaN substrate or a SiC substrate for growing InGaN or AlGaN thereon. The substrate 10 includes the upper surface 10a. In one embodiment, the upper surface 10a is a flat surface. In another embodiment, the substrate 10 includes a patterned substrate; that is, the substrate 10 includes a patterned structure (not shown) on the upper surface 10a. The patterned structure includes a plurality of protrusions or a plurality of recesses. In an embodiment, the light emitted from the semiconductor stack 12 can be refracted by the patterned structure of the substrate 10, thereby improving the brightness of the LED. In addition, the patterned structure lessens or suppresses the dislocation caused by lattice mismatch between the substrate 10 and the semiconductor stack 12, thereby improving the epitaxy quality of the semiconductor stack 12.

Semiconductor Stack

In an embodiment of the present application, the semiconductor stack 12 is formed on the substrate 10 by metal organic chemical vapor deposition (MOCVD), molecular beam epitaxy (MBE), hydride vapor epitaxy (HVPE) or ion plating such as sputtering or evaporating.

A buffer structure (not shown), a first semiconductor layer 121, an active region 123, and a second semiconductor layer 122 are sequentially formed on the substrate 10. The semiconductor stack 12 includes the buffer structure, the first semiconductor layer 121, the active region 123, and the second semiconductor layer 122. The buffer structure reduces the lattice mismatch and suppresses dislocation so as to improve the epitaxy quality. The material of the buffer structure includes GaN, AlGaN, or AlN. In an embodiment, the buffer structure includes a plurality of sub-layers (not shown) having the same material or different materials. In one embodiment, the buffer structure includes a first sub-layer and a second sub-layer. The first sub-layer is grown by sputtering or MOCVD and the second sub-layer thereof is grown by MOCVD. In another embodiment, the buffer structure further includes a third sub-layer. The third sub-layer is grown by MOCVD, and the growth temperature of the second sub-layer is higher or lower than the growth temperature of the third sub-layer. In an embodiment, the first, second, and third sub-layers include the same material, such as AlN. In an embodiment, the first semiconductor layer 121 and the second semiconductor layer 122 are, for example, cladding layer or confinement layer. The first semiconductor layer 121 and the second semiconductor layer 122 have different conductivity types, different electrical properties, different polarities or different dopants for providing electrons or holes. For example, the first semiconductor layer 121 is an n-type semiconductor and the second semiconductor layer 122 is a p-type semiconductor. The active region 123 is formed between the first semiconductor layer 121 and the second semiconductor layer 122. Driven by a current, electrons and holes are combined in the active region 123 to convert electrical energy into optical energy for illumination. The wavelength of the light generated by the semiconductor stack 12 can be adjusted by changing the physical properties and chemical composition of one or more layers in the semiconductor stack 12.

The material of the semiconductor stack 12 includes III-V semiconductor with $Al_xIn_yGa_{(1-x-y)}N$ or $Al_xIn_yGa_{(1-x-y)}P$, where $0 \leq x$, $y \leq 1$; $x+y \leq 1$. When the material of the active region of the semiconductor stack 12 includes AlInGaP, the semiconductor stack 12 emits red light having a wavelength between 610 nm and 650 nm or yellow light having a wavelength between 550 nm and 570 nm. When the material of the active region of the semiconductor stack 12 includes InGaN, the semiconductor stack 12 emits blue light or deep blue light having a wavelength between 400 nm and 490 nm or green light having a wavelength between 490 nm and 550 nm. When the material of the active region of the semiconductor stack 12 includes AlGaN, the semiconductor stack 12 emits UV light having a wavelength between 250 nm and 400 nm. The active region 123 can be a single heterostructure (SH), a double hetero-structure (DH), a double-side double hetero-structure (DDH), or a multi-quantum well (MQW). The material of the active region 123 can be i-type, p-type or n-type.

Transparent Conductive Layer

The transparent conductive layer 18 covers the upper surface of the second semiconductor layer 122 of each LED 1 and electrically connects with the second semiconductor layer 122. The transparent conductive layer 18 can be metal or transparent conductive material. The metal material can form a thin metal layer having light transparency. The transparent conductive material is transparent to the light emitted by the active region 123, such as grapheme, indium tin oxide (ITO), aluminum zinc oxide (AZO), gallium zinc oxide (GZO), zinc oxide (ZnO) or indium zinc oxide (IZO). In another embodiment, the LED 1 does not include the transparent conductive layer 18 and the opening 502 exposes the second semiconductor layer 122.

Insulating Layer

The insulating layer 50 is transparent to the light emitted from the semiconductor stack 12, and can be a layer composed of a single insulating material or a stack composed of multiple layers of different insulating materials. In one embodiment, the insulating layer 50 is formed by alternately stacking a pair or a plurality of pairs of insulating materials with different refractive indices. The insulating material includes silicon oxide, silicon nitride, silicon oxynitride, niobium oxide, hafnium oxide, titanium oxide, magnesium fluoride, aluminum oxide, etc. In one embodiment, by selecting insulating materials with different refractive indices and the thickness thereof, the insulating layer 50 functions as a reflective structure such as distributed Bragg reflector. The reflective structure selectively reflects the light within a specific wavelength range. The insulating layer 50 can be formed by atomic layer deposition (ALD), sputtering, evaporation, spin-coating, etc. In another embodiment, the insulating layer 50 includes a stack of multiple layers of the same insulating material formed by different methods or different insulating materials formed by different methods.

Electrode

The electrodes include a first electrode 20 and a second electrode 30. The material of the electrode includes metals, such as Cr, Ti, Au, Al, Cu, Sn, Ni, Rh, W, Pt, an alloy or a laminated stack composed by the above materials.

In this embodiment, the size of the LED 1 has a diagonal length less than 150 μm, and the distance between the first electrode 20 and the second electrode 30 is less than 30 μm. In another embodiment, the size of the LED 1 has a diagonal length less than 100 μm, and the distance between the first electrode 20 and the second electrode 30 is less than or equal to 25 μm. After completing the step S2, the plurality of LEDs 1 are tested in the step S3.

Figure 3:
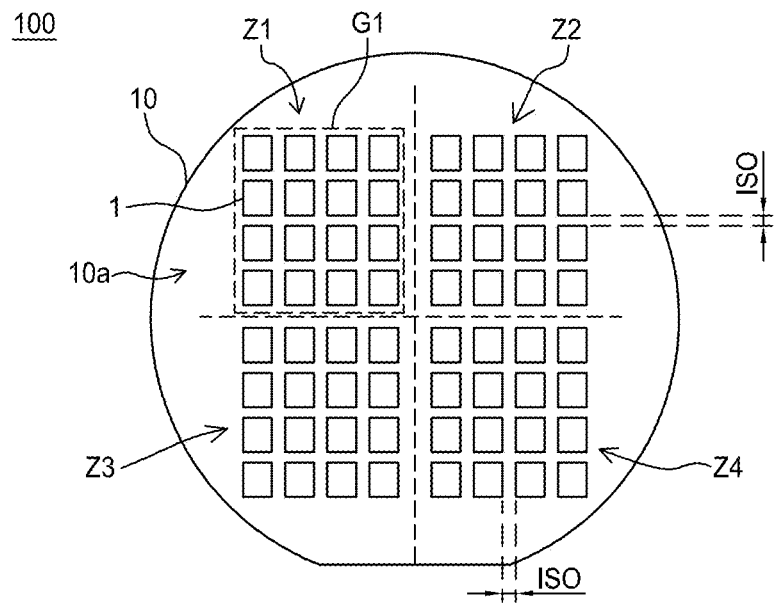
FIG. 3 shows a top view of a step in the LED manufacturing method in accordance with an embodiment of the present application.

In order to test the LEDs, a testing circuit is formed on the wafer 100. First, as shown in FIG. 3, the wafer 100 is divided into a plurality of zones such as a first zone Z1 to a fourth zone Z4. Each of the first zone Z1, the second zone Z2, the third zone Z3 and the fourth zone Z4 includes N LEDs 1 arranged in an array and the N LEDs 1 in one zone are defined as an LED group G1. The testing circuit is formed in each zone. The testing circuit is formed on the upper surface 10a of the substrate 10, including on the isolation region ISO. In the present application, the number N of the LEDs 1 in each zone, the arrangement of the LEDs 1, the allocations of the zones, the area of each zone and the quantity of the zones can have different designs in accordance with the requirements of use and testing.

FIGS. 4A, 4B, 4C and 4D show a testing circuit in a single zone in accordance with different embodiments of the present application, respectively. The following embodiments only show the testing circuit in one zone on the substrate, and the testing circuit in the other zones on the substrate can be selected from any of the same testing circuit or different testing circuits in the following embodiments.

Figure 4A:
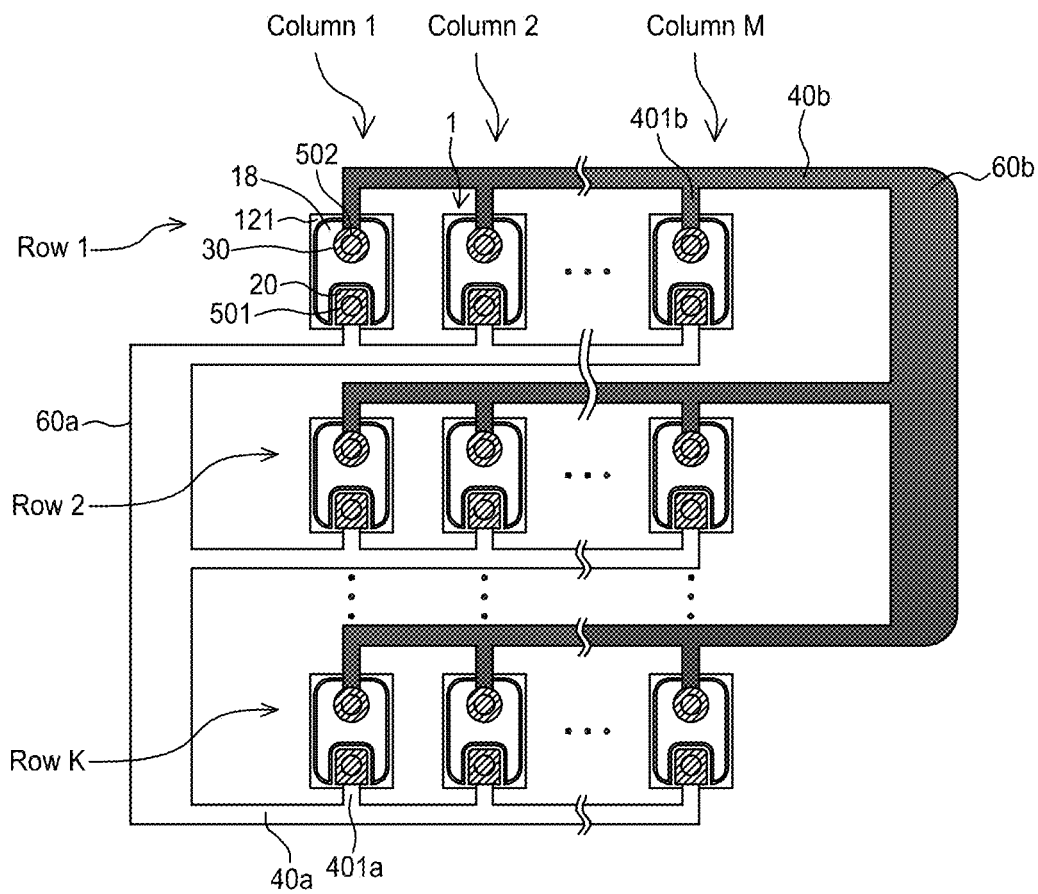
FIG. 4A shows a testing circuit in a single zone in accordance with an embodiment of the present application.

As shown in FIG. 4A, the N LEDs 1 are arranged into an array with K rows and M columns. The testing circuit includes a first testing pad 60a, a second testing pad 60b, a first wire 40a, a second wire 40b, a first branch wire 401a and a second branch wire 401b. Each of the first branch wires 401a is connected to the first electrode 20 of each LED 1, and is electrically connected to the first testing pad 60a via the first wire 40a. Each of the second branch wire 401b is connected to the second electrode 30 of each LED 1, and is electrically connected to the second testing pad 60b via the second wire 40b. In this way, the LED group G1 in the zone forms a parallel circuit. The photoelectric characteristics of the LED group G1 in the zone can be obtained by using the probes to touch the testing pad such as the first testing pad 60a and the second testing pad 60b and inputting a current into the LED group G1.

In another embodiment (not shown), the testing circuit includes a plurality of first testing pad 60a and/or a plurality of second testing pad 60b. For example, the N LEDs 1 are arranged in K rows, the first electrodes 20 of the LEDs 1 in the same row is connected to the same first testing pad 60a, and the second electrodes 30 of the LEDs 1 in the same row is connected to the same second testing pad 60b. The LEDs 1 in the same row are electrically connected in parallel. In the zone, the testing circuit includes K first testing pad 60a and K second testing pad 60b. In this way, the LEDs 1 of each row in the LED group 1 can be tested respectively.

Figure 4B:
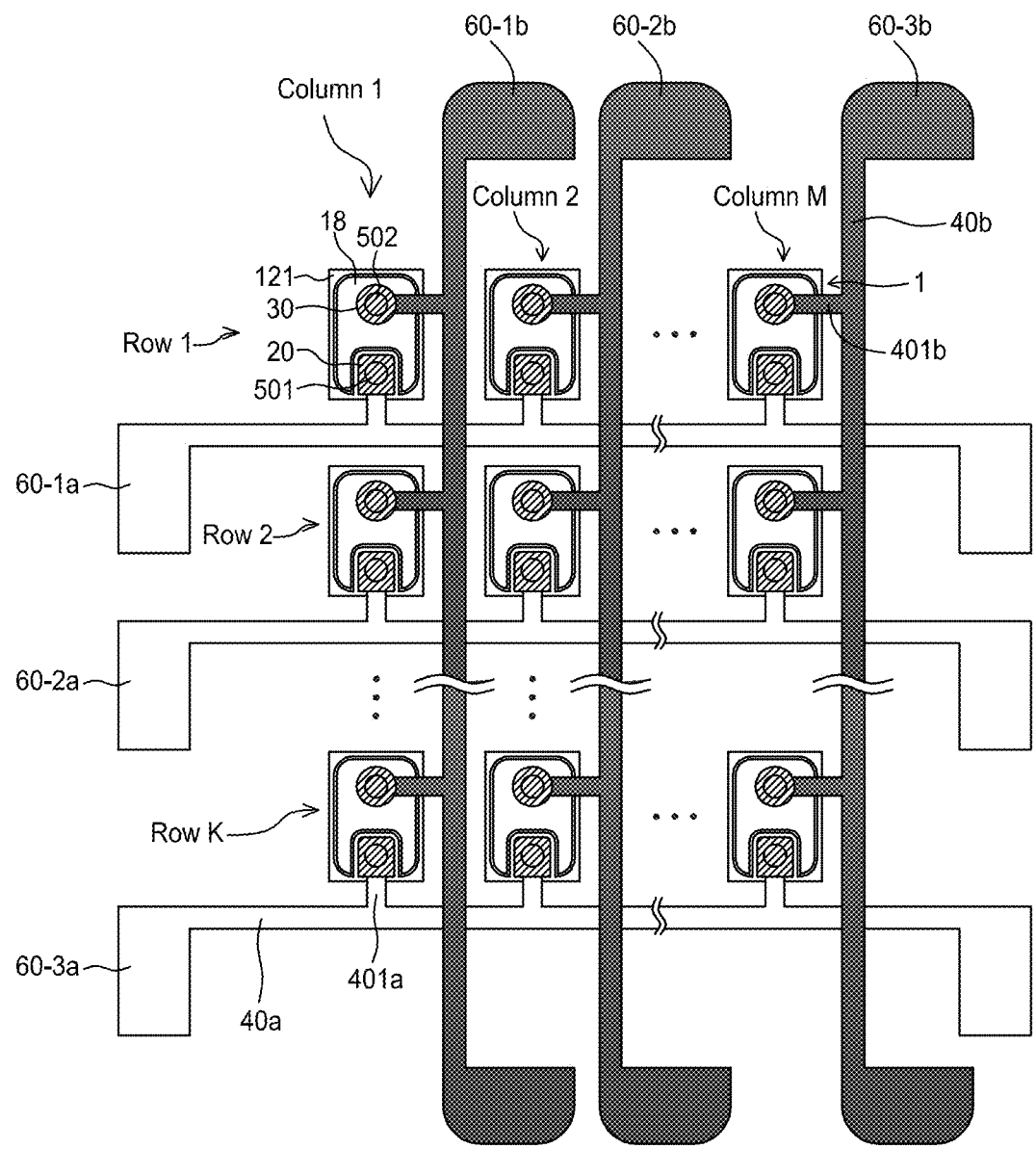
FIG. 4B shows a testing circuit in a single zone in accordance with another embodiment of the present application.

FIG. 4B shows the testing circuit in a single zone in accordance with another embodiments of the present application. The N LEDs 1 are arranged in K rows and M columns. In the embodiment, the first electrodes 20 of the plurality of LEDs 1 located in the same row (row 1, row 2, ... row K) are electrically connected to the first testing pads 60-1a, 60-2a, and 60-3a on both sides of the row via the first wires 40a and the first branch wires 401a. For example, the first electrodes 20 of the plurality of LEDs 1 located in the first row (row 1) are electrically connected to the first testing pads 60-1a on both sides of the first row (row 1) via the first wire 40a and the first branch wires 401a. The second electrodes 30 of the plurality of LEDs 1 located in the same column (column 1, column 2, ... column M) are electrically connected to the second testing pads 60-1b, 60-2b, and 60-3b on both sides of the column via the second wires 40b and the second branch wires 401b. The first wire 40a and the first branch wire 401a connected to the first electrode 20 are electrically insulated from the second wire 40b and the second branch wire 401b connected to the second electrode 30. In one embodiment, the second wire 40b and/or the second branch wire 401b are formed on the first wire 40a and/or the first branch wire 401a in a bridge manner, and an insulating layer (not shown) is formed between the overlapping portions between the two. In one embodiment, the insulating layer can be formed on the entire surface of the LEDs 1, the first wire 40a and the first branch wire 401a. The insulating layer includes openings (not shown) to expose the second electrodes 30, and then the second branch wires 401b and the second wires 40b that are connected to the second electrode 30 are formed thereon. The second branch wires 401b and the second wires 40b are electrically insulated from the first wires 40a and the first branch wires 401a by the insulating layer.

In this embodiment, selective testing can be performed. The N LEDs 1 are arranged into a two-dimensional array of K rows and M columns. For example, by using probes to contact the first testing pad 60-2a and the second testing pad 60-2b and inputting a testing current, the photoelectric characteristics of the LED 1 at the second column and the second row can be obtained. For example, by using probes to contact the first testing pad 60-1a and the second testing pad 60-3b and inputting a testing current, the photoelectric characteristics of the LED 1 at the $M^{th}$ column and the first row can be obtained.

Figure 4C:
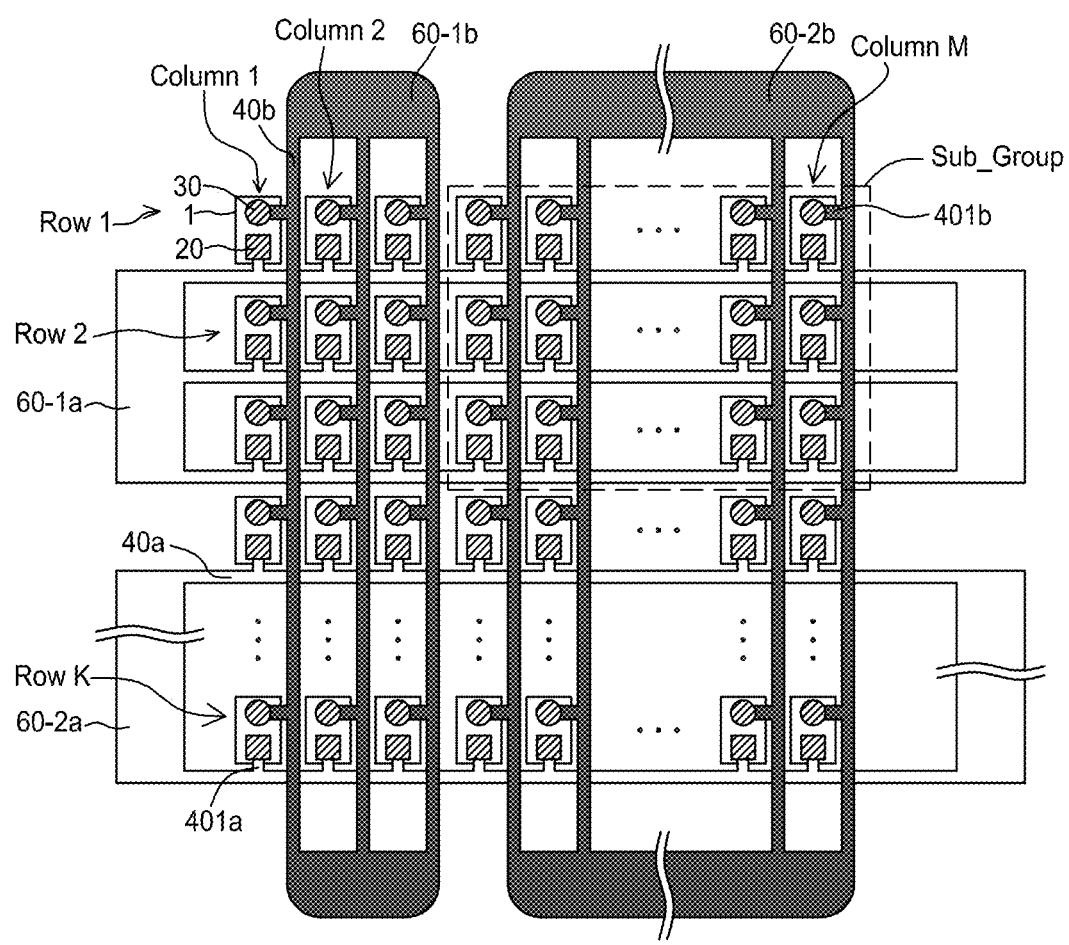
FIG. 4C shows a testing circuit in a single zone in accordance with another embodiment of the present application.

FIG. 4C shows a testing circuit in a single zone in accordance with another embodiment of the present application. As shown in FIG. 4C, the LEDs 1 in the single zone are further divided into sub-groups. The LEDs in adjacent rows in the sub-group are connected to a common first testing pad and the LEDs in adjacent columns in the sub-group are connected to a common second testing pad. For example, the second wires 40b which are connected to the LEDs in the first column to the third column are connected to a common second testing pad 60-1b and the first wires 40a which are connected to the LEDs in the first row to the third row are connected to a common first testing pad 60-1a. By using probes to touch the first testing pad 60-1a and the second testing pad 60-1b and inputting a testing current, the photoelectric characteristics of nine LEDs 1 in the sub-group located in the first column to the third column and in the first row to the third row can be obtained. By using probes to contact the first testing pad 60-1a and the second testing pad 60-2b and inputting a testing current, the photoelectric characteristics of the plurality of LEDs 1 located in the fourth column to the $M^{th}$ column and in the first row to the third row (i.e. the LEDs 1 in the sub-group enclosed by the dash line shown in FIG. 4C) can be obtained. In this manner, a selective testing for the sub-group can be further performed in the LED group G1. The formation of the insulating layer between the first wire 40a (first branch wire 401a) and the second wire 40b (second branch wire 401b) is similar to the embodiment of FIG. 4B, and will not be repeated.

In another embodiment (not shown), the first wires 40a of each row shown in FIG. 4B or FIG. 4C are connected to the same first testing pad, and the second wires 40b of each column are connected to the same second testing pad. In this way, all the LEDs 1 in the zone can be tested at the same time. In addition, compared to the embodiment shown in FIG. 4A that the LEDs 1 in the same row are electrically connected in parallel and the wires 40a and 40b are arranged in the same direction (e.g., horizontal direction), the wires 40a and 40b of the present embodiment are arranged in different directions; that is, the first wires 40a are arranged horizontally and the second wires 40b are arranged vertically. The area occupied by the wires can be reduced. Therefore, in the present embodiment, more LEDs 1 can be formed in a unit area on the wafer and more LEDs 1 can be tested at the same time.

Figure 4D:
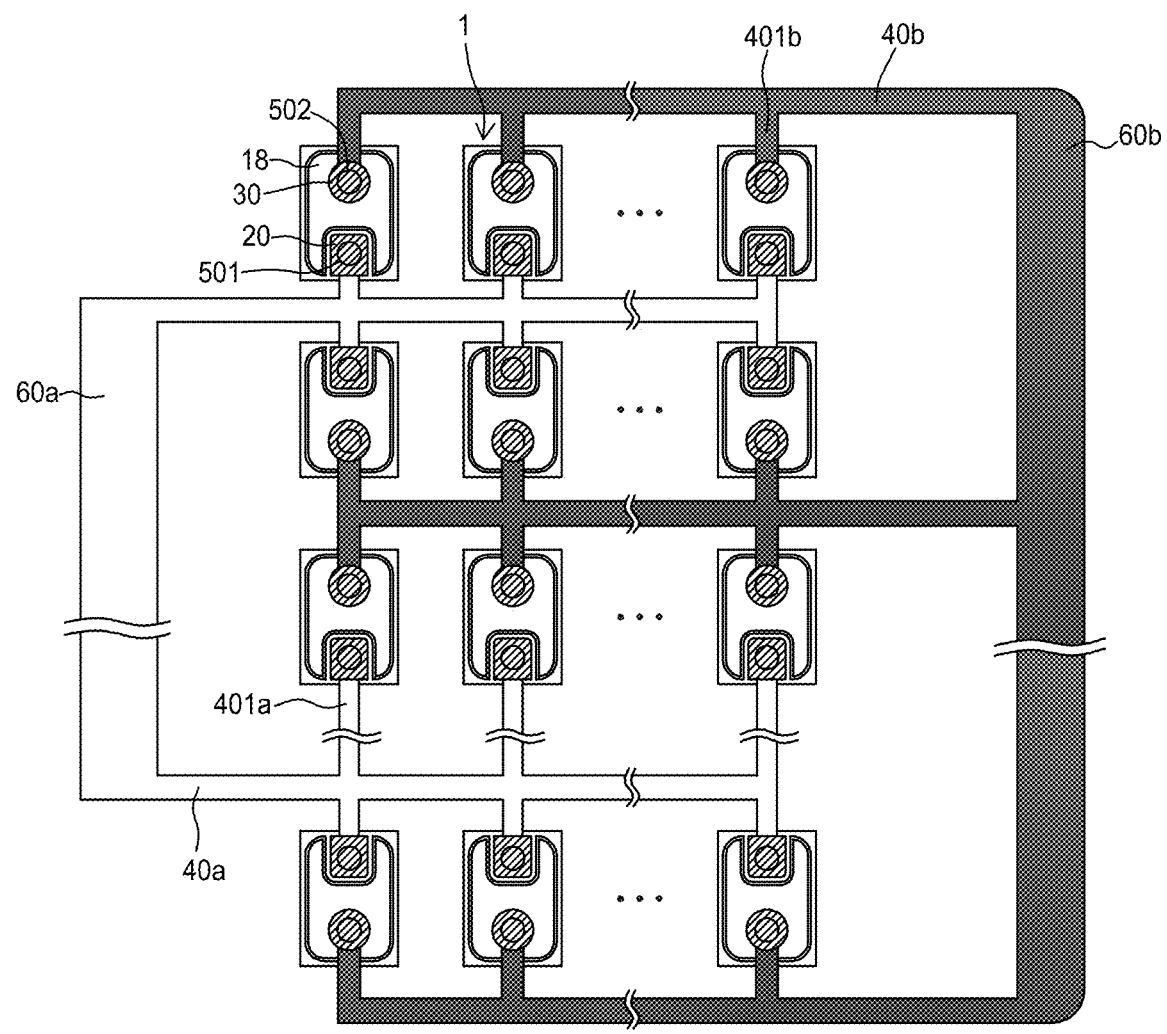
FIG. 4D shows a testing circuit in a single zone in accordance with another embodiment of the present application.

FIG. 4D shows a testing circuit in a single zone in accordance with another embodiment of the present application. The electrical connection in the present embodiment is similar with that of FIG. 4A. The difference is that, in this embodiment, the first electrodes 20 of one LED 1 is adjacent to the first electrode 20 of an adjacent LED 1 in the same column. The second electrode 30 of the one LED 1 is adjacent to the second electrode 30 of another adjacent LED 1 in the same column. In this way, the first electrodes 20 of two adjacent LEDs 1 in the same column connect to the same first wire 40a and the second electrodes 30 of two adjacent LEDs 1 in the same column connect to the same second wire 40b. The number of the wires 40a and 40b in this embodiment is less than that in the previous embodiment, and the area on the wafer occupied by the wires can be reduced. Therefore, in the present embodiment, more LEDs 1 can be formed in a unit area on the wafer and more LEDs 1 can be tested at the same time.

In one embodiment, the LEDs 1 are subsequently transferred to a target carrier such as a carrier of an end-product or a carrier of an LED module in groups. The arrangement and the grouping of the LEDs 1 on the substrate 10, such as the numbers of the rows and the columns, or the distance between adjacent LEDs, depend on the arrangement of the LEDs 1 on the target carrier or the module carrier. While the arrangement of the LEDs 1 on the target carrier or the module carrier has high density and small pitch, the LEDs 1 on the substrate 10 has the corresponding arrangement. Otherwise, the arrangement of the LEDs may cause the upper surface of the wafer 100 does not have sufficient space for disposing the testing circuit, then testing the LEDs 1 on the wafer 100 would be difficult.

In accordance with the layouts of the testing circuits shown in the embodiments of the present application, the space on the upper surface of the substrate 10 can be effectively used to form the testing circuit and performing LED 1 testing.

Testing Circuit

The testing circuit includes the first testing pads 60a, 60-1a, 60-2a and 60-3a, the second testing pads 60b, 60-1b, 60-2b and 60-3b, first wire 40a, second wire 40b, the first branch wire 401a and the second branch wire 401b. When testing the LED group in a single zone, the forward voltage of each of the plurality of parallel-connected LEDs 1 are substantially equal; for example, the starting voltage and the operating voltage of each LED measured at a specific current are substantially equal. This ensures that the photoelectric characteristics measured from each LED 1 in a single group are correct based on the same operating voltage. Taking the embodiment shown in FIG. 4A as an example, each of the second wires 40b between any two adjacent columns can be regarded as a node. The difference between the operating voltage (or the starting voltage) of the LED measured from the first testing pad 60a and the first node and the operating voltage (or the starting voltage) of the LED measured from the first testing pad 60a and the second testing pad 60b is less than 5 mV.

The material of the testing circuit includes metals, such as Cr, Ti, Au, Al, Cu, Sn, Ni, Rh, W, In, Pt or an alloy or a laminated stack of the above materials. The selection of the above metal materials for forming the testing circuit depends on user's requirement. The user's requirement includes, for example, the space of the substrate 10 that can be used to form the testing circuit, the layout of the testing circuit, etc. Metal materials with suitable resistance and length can be selected for forming the testing circuit to meet the requirement that the forward voltages of each of the plurality of parallel-connected LEDs 1 are substantially equal. Preferably, the material of the testing circuit is different from the material of a top layer of the first electrode 20 and the second electrode 30.

After the LED testing is completed, the testing circuit is removed by, for example, wet etching or dry etching. In the embodiment of removing the testing circuit by wet etching, the etchant has the characteristic of removing the testing circuit but not damaging the top layer of the first electrode 20 and the second electrode 30.

In one embodiment, the photoelectric characteristics of the LEDs 1 obtained in the testing methods in accordance with the embodiments can be presented in images. The image can be used to identify if the photoelectric characteristics of each of the LEDs 1 are substantially consistent or if any LEDs 1 is damaged, failed, or whose photoelectrical characteristics does not meet the specification. In the present application, the damaged LED, the failed LED, and the LED whose photoelectrical characteristics does not meet the specification are defined as a defective LED.

Figure 5:
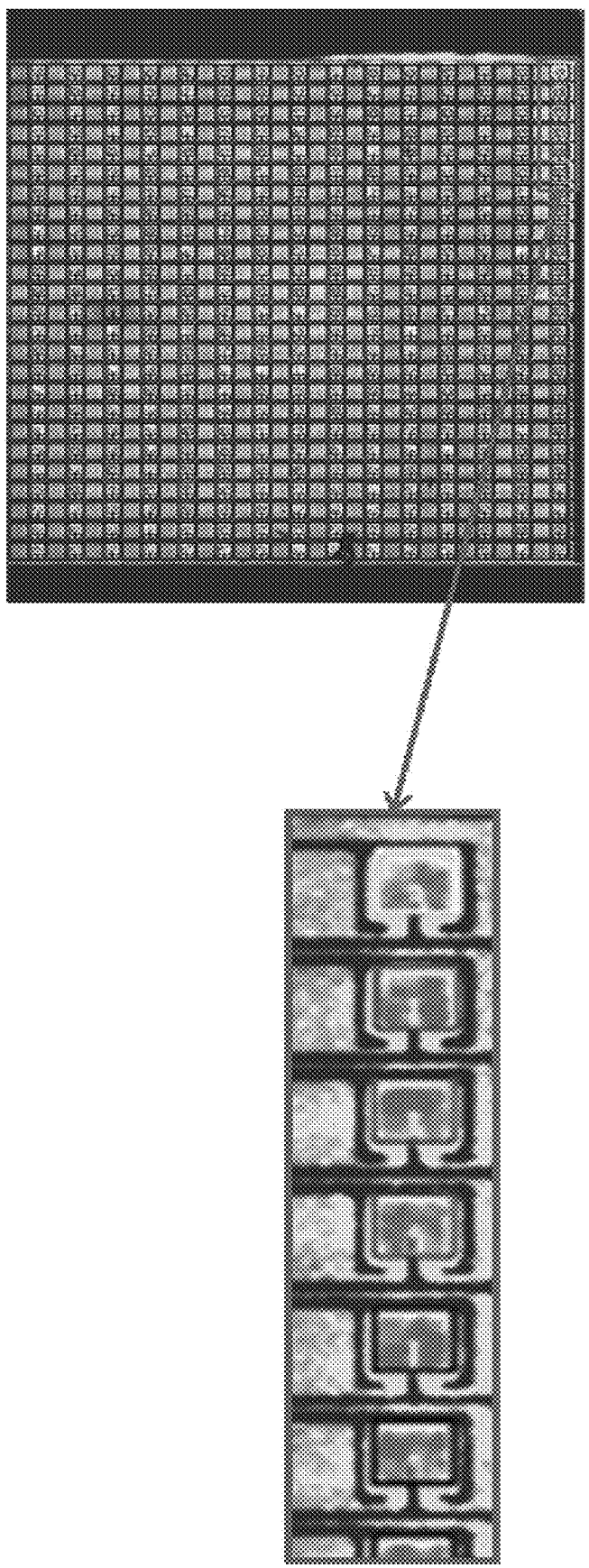
FIG. 5 shows a near-field image of a LED group in accordance with an embodiment of the present application.

In one embodiment, the photoelectric characteristics of the LEDs 1 obtained by the testing method in accordance with the embodiments can be presented in a gray scale image or RGB color image. The brightness of all LEDs 1 in a zone can be distinguished by the shade of the image. In one embodiment, a luminance meter, spectroradiometer, near-field measurement system, photoluminescence (PL) measurement system can be used to test the LEDs 1 and obtain the gray scale image or the RGB color image. FIG. 5 shows a near-field image of the LED group G1 lit in one zone on the wafer.

The measured photoelectric characteristic of the LEDs 1 in the testing method which is presented in an image form has the following characteristics: 1) Near-field measurement or photoluminescence (PL) measurement can be used to determine the brightness of the LEDs by intensity; 2) The wavelength spectrum of each LED can be obtained; and 3) A current of 1 pA to 100 μA is inputted into the LEDs to slightly light up the LEDs. Defective LEDs with abnormal reverse current can be picked out based on the dim brightness of the LEDs.

In the present application, the wafer 100 is divided into a plurality of zones and the testing circuit formed in each zone is used for testing the LEDs, which solves the problem that the electrodes of the small-sized LED are too small to perform conventional testing for each LED. The LEDs in a single zone are tested at a time and the photoelectric characteristics of the LED group can be obtained through the division of the wafer. In one embodiment, the field of view of the optical lens of the testing system covers whole single zone or a plurality of zones at a time, and a plurality of probes can be placed on the plurality of testing pads for testing the LEDs in one zone or in the plurality of zones at a time.

In one embodiment, if the LEDs 1 in any one of the plurality zone on the wafer 100 is damaged or failed, the LEDs 1 in other zones can still be selectively turned on to measure the photoelectric characteristics of the LEDs in these zones. For example, if any of the LEDs 1 in the first zone Z1 are damaged or failed, the LEDs 1 in the second zone Z2 to the fourth zone Z4 can be selectively tested. As a result, the efficiency of the LED testing can be improved.

In addition, if a part of the LEDs 1 in one zone on the wafer 100 are damaged or failed, the other LEDs 1 in the present zone can still be selectively turned on, and the photoelectric characteristics of the other LEDs 1 can be measured. For example, when the overall yield of the LEDs 1 in the first zone Z1 meets user's specifications and the first zone Z1 is identified as a compliant zone, even a part of the LEDs 1 in the first zone Z1 are damaged or failed, the other LEDs 1 in the first zone Z1 can still be tested.

In addition, the testing circuit in the present application has the functions of regional testing and selective testing. During the testing process, the location of the LEDs 1 can be obtained through the testing apparatus.

As described in the above embodiments, the wafer 100 is divided into a plurality of zones such as the first zone Z1 to the fourth zone Z4. Through the optical lens of the testing system, the position such as the coordinate of each LED 1 in each zone and the coordinates of each zone in the wafer 100 can be obtained.

In any of the first zone Z1 to the fourth zone Z4, the testing system can perform luminance measurement, spectroradiometer measurement, near-field measurement, or photoluminescence (PL) measurement. Through the optical lens of the testing system, each LED 1 can be identified and its location can be defined. The measurement result can be represented by the coordinates.

For example, during testing the LEDs 1 the first zone Z1 to the fourth zone Z4 by probes at a time, when an LED 1 in the second zone Z2 is identified as a defective LED according to the obtained image, the coordinates of the second zone Z2 on the wafer 100 and the coordinates of the defective LED 1 in the second zone Z2 can be obtained by the testing system.

The position such as the coordinates of the LED 1 can be used for the following process. In one embodiment, the defective LED is removed and then the other LEDs are transferred. In another embodiment, during the process of transferring the LEDs 1 to a temporary carrier and removing the substrate 10, the defective LED can be removed together with the substrate 10. In another embodiment, during the process of transferring the LEDs 1 to the temporary carrier, the defective LED is not transferred to the temporary carrier and the other LEDs are transferred to the temporary carrier. In another embodiment, the defective LED can be repaired after the process of transferring the LEDs 1 is completed. The transferring process described above includes transferring the LEDs to the temporary carrier, to the target carrier or to the module carrier. In one embodiment, the repairing method includes removing the defective LED from the target carrier or the module carrier, and placing a good LED as a substitute at the position of the defective LED. In another embodiment, the repairing method includes providing a backup circuit on the target carrier or the module carrier. A good LED is placed on the vicinity of the defective LED, connected and driven by the backup circuit while the defective LED is not removed from the target carrier or the module carrier. In another embodiment, if the defective LED is removed from the substrate before the process of transferring or is not transferred, the corresponding position thereof on the temporary carrier, the target carrier or the module carrier is vacant. A good LED can be placed on the vacant position of the defective LED as a substitute.

Figure 6:
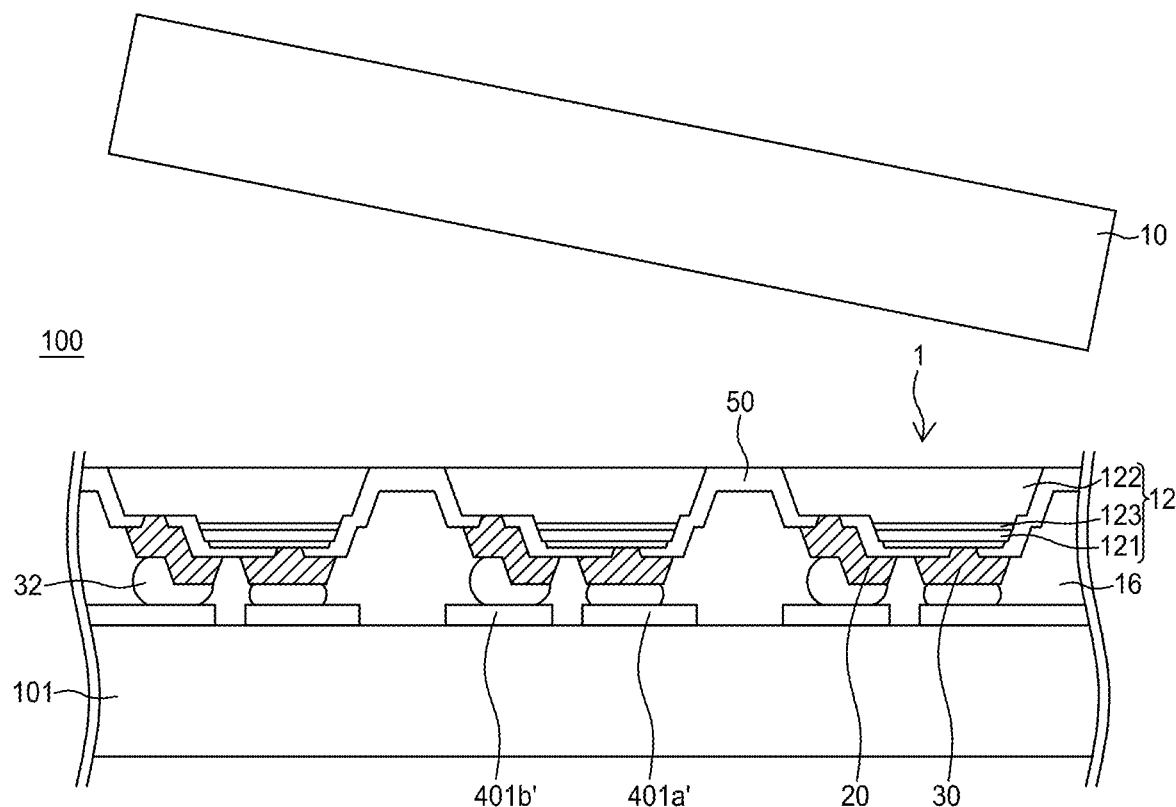
FIG. 6 shows a cross-sectional view of a step in the LED manufacturing method in accordance with an embodiment of the present application.

Next, in the step S4 after the step S3 of testing the plurality of LEDs 1, the testing circuit on the wafer 100 is removed, the wafer 100 is joined to another substrate, such as a temporary carrier 101, and the substrate 10 is removed. As shown in FIG. 6, the wafer 100 is joined to the temporary carrier 101 with a bonding layer 16, and then the substrate 10 is removed by, for example, a laser lift-off or chemical lift-off method, to expose the semiconductor stack 12. In one embodiment, the temporary carrier 101 includes glass, sapphire substrate, or polymer materials such as acrylic and polycarbonate (PC).

Figure 7:
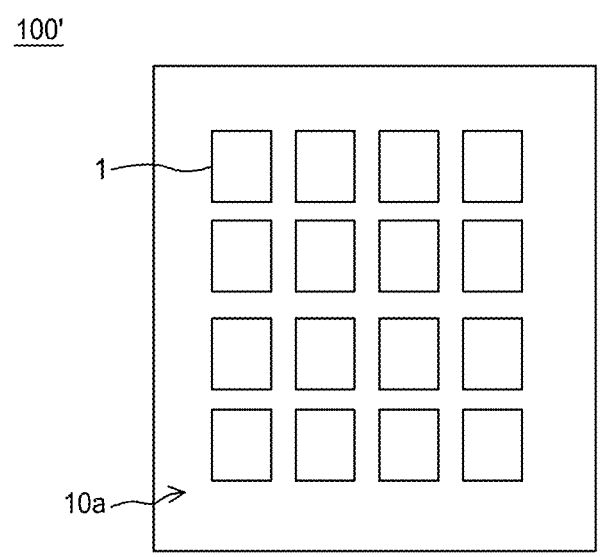
FIG. 7 shows the top view of a sub-wafer in accordance with an embodiment of the present application.

In one embodiment, after removing the testing circuit, the wafer 100 can be cut into a plurality of sub-wafers 100' as shown in FIG. 7 corresponding to the first zone Z1 to the fourth zone Z4, and the plurality of sub-wafers 100' are joined to the temporary carrier 101, and then the substrates 10 in each of the sub-wafers 100' is removed to expose the semiconductor stack 12.

After removing the substrate 10, the LEDs 1 are tested in an optional step S5 to measure the characteristics, such as photoelectric characteristics, of the LEDs that are transferred to the temporary carrier 101. A testing circuit is formed on and around the LEDs 1 like the testing circuit formed in the step S3, but being different from the testing circuit formed in the step S3, any of the testing circuits described in the aforementioned embodiments is formed on the surface of the temporary carrier 101 as shown in FIG. 6. FIG. 6 shows an example of the first branch wire 401a' and the second branch wire 401b' of the testing circuit. When joining the wafer 100 and the temporary carrier 101, the first electrode 20 and the second electrode 30 of the LED 1 are respectively connected to the first branch wire 401a' and the second branch wire 401b' through a conductive adhesive layer 32 so that the LED 1 and the testing circuit on the temporary carrier 101 are electrically connected. In one embodiment, the conductive adhesive layer 32 includes metal, such as solder, Au—Sn eutectic, or other metal (gold, indium) bonding techniques.

The details of the testing method in the step S5 is the same as the aforementioned step S3 and is not be repeated here. Although FIG. 6 does not show the whole testing circuit on the temporary carrier 101, people having ordinary skill in the art can understand that the testing circuit on the temporary carrier 101 can include the wiring layouts shown in FIGS. 4A-4D, a parallel connection, and a series-parallel connection. In this step, the testing pad (not shown in FIG. 6) on the temporary carrier 101 can be used to perform regional testing on the LEDs 1. Similar to the embodiment in FIG. 3, the temporary carrier 101 is divided into a plurality of zones and the testing circuit is formed in each zone. The LED group G1 can be tested in each zone.

In another embodiment, the testing step S5 is not performed. In this case, the temporary carrier 101 does not have the testing circuit and the conductive adhesive layer 32 formed thereon.

In one embodiment, the temporary carrier 101 includes one zone or a plurality of zones of the LED groups G1. When the one zone or any one of the plurality of zones includes a defective LED, the position of the defective LED can be defined and recorded by the testing method in accordance with aforementioned step S3 and/or the step S5.

Next, in the step S6, the LEDs 1 on the temporary carrier 101 are transferred. For example, the LEDs 1 are transferred from the temporary carrier 101 to the target carrier or the module carrier by group, and then an end-product manufacturing process or a module manufacturing process is performed, as shown in the step S7 in FIG. 1. For example, a wavelength conversion material, such as a phosphor material or a quantum dot material, is formed on the LEDs 1 that have been transferred and an encapsulation material is coated to form a packaging module, and then a display panel is assembled in subsequent processes. In one embodiment, the target carrier includes a display backplane. In one embodiment, the LEDs 1 are taken up from the temporary carrier 101 by picking or sucking, and then placed on the target carrier or the module carrier.

In one embodiment, the LED groups in the plurality of zones on the temporary carrier 101 can be classified according to the photoelectric characteristics thereof. The plurality of LED groups with the same photoelectric characteristic, that is, the plurality of LED groups in the same classification, can be placed on a carrier board (not shown). The same photoelectric characteristic can be the same wavelength. In one embodiment, the average wavelength of each of the LED groups can be measured. Then, the plurality of LED groups with the same average wavelength which is included in one classification is joined to the same carrier board. The plurality of LED groups of different classifications can be respectively joined to different regions on the same carrier board or to different carrier boards according to user's requirement. Next, the LEDs are taken up from the carrier board by picking or sucking, and then placed on the target carrier or the module carrier. In another embodiment, the temporary carrier 101 can be divided into a plurality of individual sections according to the plurality of zones, and then the LED groups on the individual sections are classified according to the photoelectric characteristics thereof. The subsequent processes such as joining to the carrier board and transferring to the target carrier or the module carrier are the same as described above.

After removing the substrate 10, the testing process is performed to inspect whether any defective LEDs exist after the substrate 10 is removed. In one embodiment, the defective LEDs can be removed in accordance with the coordinates thereof, and then the other LEDs are transferred to the target carrier or the module carrier. In another embodiment, the defective LED is not transferred to the target carrier or the module carrier and only the other the other LEDs are transferred. In another embodiment, the defective LED can be repaired on the target carrier or the module carrier after being transferred. In another embodiment, if the defective LED is removed from the substrate before the process of transferring or is not transferred to the temporary carrier, the corresponding position thereof on the target carrier or the module carrier is vacant after transferring. A good LED can be placed on the vacant position of the defective LED as a substitute.

In another embodiment, similar to the embodiments mentioned above, the difference is that after the step S3 is completed, only part of the process in the step S4 is then performed; that is, the testing circuit on the wafer 100 is removed after testing, but the processes of joining the wafer 100 to the temporary carrier 101 and removing the substrate 10 are not performed. In one embodiment, the wafer 100 is divided into a plurality of sub-wafers 100' as shown in FIG. 7 corresponding to first zone Z1 to the fourth zone Z4 after removing the testing circuit. In another embodiment, after the step S3 is completed, the step S6 is subsequently preformed and the steps S4 and S5 are skipped. The LEDs 1 on the substrate 10 are transferred to the target carrier or the module carrier by group after removing the testing circuit, and then an end-product manufacturing process or a module manufacturing process as shown in the step S7 in FIG. 1 is performed.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

What is claimed is:

1. A manufacturing method for a light-emitting diode (LED), comprising:
   providing a substrate, comprising an upper surface, wherein the upper surface is divided into a plurality of zones;
   forming a plurality of LED groups formed on the upper surface, wherein:
      the plurality of the LED groups is respectively formed on the plurality of zones and each of the plurality of the LED groups comprises a plurality of LEDs;
      the plurality of the LED groups comprises a first LED group; and
      the plurality of LEDs of the first LED group comprises one or more defective LEDs;
   forming a testing circuit on the substrate, electrically connecting the plurality of LEDs in the first LED group to form a parallel circuit or a series-parallel circuit;
   testing the first LED group by the testing circuit;
   recording a position of the one or more defective LEDs;
   providing a target carrier or a module carrier; and
   performing one of the following steps by the position of the one or more defective LEDs:
      removing the one or more defective LEDs from the substrate, and then transferring the other of the plurality of LEDs in the first LED group to the target carrier or the module carrier;
      not transferring the one or more defective LEDs, but transferring the other of the plurality of LEDs in the first LED group to the target carrier or the module carrier; or
      transferring the plurality of LEDs to the target carrier or the module carrier and repairing the one or more defective LEDs on the target carrier or the module carrier.

2. The manufacturing method according to claim 1, wherein the one or more defective LEDs comprises a damaged LED, a failed LED, or an LED which photoelectrical characteristic does not meet specification.

3. The manufacturing method according to claim 1, wherein the step of testing the first LED group by the testing circuit comprises presenting photoelectric characteristics of the first LED group in an image, and identifying the one or more defective LEDs by the image.

4. The manufacturing method according to claim 1, wherein the step of testing the first LED group by the testing circuit comprises inputting a testing current with 1 pA to 100 µA into the first LED group.

5. The manufacturing method according to claim 1, wherein:
   each of the plurality of LEDs comprises a first electrode and a second electrode; and
   the testing circuit comprises a first testing pad, a second testing pad, a first wire and a second wire;
   wherein the first electrode is electrically connected to the first testing pad via the first wire and the second electrode is electrically connected to the second testing pad via the second wire.

6. The manufacturing method according to claim 1, further comprising removing the testing circuit after the step of testing the first LED group by the testing circuit.

7. The manufacturing method according to claim 1, wherein the substrate is a growth substrate.

8. The manufacturing method according to claim 1, further comprising dividing the substrate into a plurality of sub-wafers after the step of testing the first LED group by the testing circuit.

9. The manufacturing method according to claim 1, wherein the substrate is a temporary carrier and the first LED group is joined to the temporary carrier by a bonding layer.

10. The manufacturing method according to claim 1, wherein the step of recording a position of the one or more defective LEDs comprises:
  recording a position of the one of the plurality of zones where the one or more defective LEDs is located; and
  recording a position of the one or more defective LEDs within the first LED group.

11. A manufacturing method for a light-emitting diode (LED), comprising:
  providing a substrate, comprising a first upper surface, wherein the first upper surface is divided into a plurality of zones;
  forming a plurality of LED groups formed on the upper surface, wherein:
    the plurality of the LED groups is respectively formed on the plurality of zones and each of the plurality of the LED groups comprises a plurality of LEDs;
    the plurality of the LED groups comprises a first LED group; and
    the plurality of LEDs of the first LED group comprises one or more defective LEDs;
  proving a temporary carrier, comprising a second upper surface;
  forming a testing circuit on the second upper surface;
  transferring the first LED group to the second upper surface from the substrate and electrically connecting the plurality of LEDs in the first LED group and the testing circuit to form a parallel circuit or a series-parallel circuit; and
  testing the first LED group by the testing circuit.

12. The manufacturing method according to claim 11, wherein:
  each of the plurality of LEDs comprises a first electrode and a second electrode; and
  the testing circuit comprises a first testing pad, a second testing pad, a first wire and a second wire;
  wherein the first electrode is electrically connected to the first testing pad via the first wire and the second electrode is electrically connected to the second testing pad via the second wire.

13. The manufacturing method according to claim 12, wherein:
  the plurality of LEDs of the first LED group are arranged along a length direction of one of the plurality of LEDs into an array with M columns;
  the first electrodes of two adjacent LEDs in a same column of the M columns are adjacent to each other; and
  the second electrodes of the other two adjacent LEDs in the same column of the M columns are adjacent to each other.

14. The manufacturing method according to claim 12, further comprising forming an insulating layer between the first wire and the second wire; and wherein:
  each of the plurality of LEDs comprises a length and a width; and
  the first wire extends along the length and the second wire extends along the width.

15. The manufacturing method according to claim 12, wherein a distance between the first electrode and the second electrode of each of the plurality of LEDs is less than 30 μm.

16. The manufacturing method according to claim 12, further comprising forming a conductive adhesive layer to electrically connect the first electrode with the first wire and the second electrode with the second wire.

17. The manufacturing method according to claim 11, wherein the step of testing the first LED group by the testing circuit comprises a selective testing or a regional testing.

18. The manufacturing method according to claim 11, further comprising:
  providing a target carrier or a module carrier; and
  transferring the first LED group to the target carrier or the module carrier from the temporary carrier.

19. The manufacturing method according to claim 11, wherein the step of testing the first LED group by the testing circuit comprises inputting a testing current with 1 pA to 100 μA into the first LED group.

20. The manufacturing method according to claim 11, wherein each of the plurality of LEDs comprises a diagonal length less than 150 μm.

* * * * *